(12) United States Patent
Gavish

(10) Patent No.: US 6,692,995 B2
(45) Date of Patent: Feb. 17, 2004

(54) PHYSICALLY DEPOSITED LAYER TO ELECTRICALLY CONNECT CIRCUIT EDIT CONNECTION TARGETS

(75) Inventor: Ilan Gavish, Karmiel (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/117,617

(22) Filed: Apr. 5, 2002

(65) Prior Publication Data

US 2003/0189252 A1 Oct. 9, 2003

(51) Int. Cl.[7] .............................................. H01L 21/82
(52) U.S. Cl. ............................ 438/130; 438/4; 438/14; 438/598
(58) Field of Search ...................... 438/4, 14, 128–130, 438/597, 598, 637

(56) References Cited

U.S. PATENT DOCUMENTS

| 4,632,724 | A | | 12/1986 | Chesebro et al. |
| 4,650,744 | A | | 3/1987 | Amano |
| 4,732,646 | A | | 3/1988 | Elsner et al. |
| 4,868,068 | A | * | 9/1989 | Yamaguchi et al. ......... 428/596 |
| 4,900,695 | A | * | 2/1990 | Takahashi et al. .......... 438/625 |
| 5,064,498 | A | | 11/1991 | Miller |
| 5,268,065 | A | | 12/1993 | Grupen-Shemansky |
| 5,438,166 | A | | 8/1995 | Carey et al. |
| 5,838,625 | A | | 11/1998 | Cutter et al. |
| 5,840,627 | A | | 11/1998 | Huggins |
| 5,844,295 | A | | 12/1998 | Tsukude et al. |
| 5,904,486 | A | | 5/1999 | Livengood et al. |
| 5,948,217 | A | | 9/1999 | Winer et al. |
| 5,952,247 | A | | 9/1999 | Livengood et al. |
| 5,976,980 | A | | 11/1999 | Livengood et al. |
| 6,020,746 | A | | 2/2000 | Livengood |
| 6,150,718 | A | | 11/2000 | Livengood et al. |
| 6,153,891 | A | | 11/2000 | Livengood |
| 6,159,753 | A | | 12/2000 | Winer et al. |
| 6,159,754 | A | | 12/2000 | Li et al. |
| 6,210,540 | B1 | * | 4/2001 | Hichwa ................. 204/192.12 |
| 6,211,527 | B1 | * | 4/2001 | Chandler ................. 250/492.2 |
| 6,228,186 | B1 | | 5/2001 | Pavate et al. |
| 6,255,124 | B1 | | 7/2001 | Birdsley |
| 6,277,659 | B1 | | 8/2001 | Goruganthu et al. |
| 6,309,897 | B1 | | 10/2001 | Livengood |
| 6,323,511 | B1 | | 11/2001 | Marsh |
| 6,376,919 | B1 | | 4/2002 | Li et al. |
| 6,566,681 | B2 | | 5/2003 | Lackey et al. |

FOREIGN PATENT DOCUMENTS

| EP | 0 295 065 | 12/1988 |
| JP | 56-46534 | 4/1981 |
| JP | 59-44827 | 3/1984 |
| JP | 1-119037 | 5/1989 |

OTHER PUBLICATIONS

Paul Winer, "IC Failure Analysis, E–Beam Tutorial", International Reliability and Physics Symposium, 1996; pp. 1–43.

Scott Silverman, "Laser Micromechanical Technology Enables Real–Time Editing of First–Run Silicon", Solid State Technology, Sep. 1996; 5 pgs.

Ann N. Campbell, "Fault Localization with the Focused Ion Beam (FIB) System", in Microelectronic Failure Analysis, ASM/International, 1996; pp. 179–187.

* cited by examiner

Primary Examiner—Amir Zarabian
Assistant Examiner—Jamie L. Brophy
(74) Attorney, Agent, or Firm—Blakely, Sokoloff, Taylor & Zafman LLP

(57) ABSTRACT

Disclosed is a layer to electrically connect targets during a circuit edit of an integrated circuit and systems and methods for forming the layer. The layer contains a conductive material, such as gold or another metal, which has been physically deposited by sputtering, thermal evaporation, and other physical deposition technique.

35 Claims, 16 Drawing Sheets

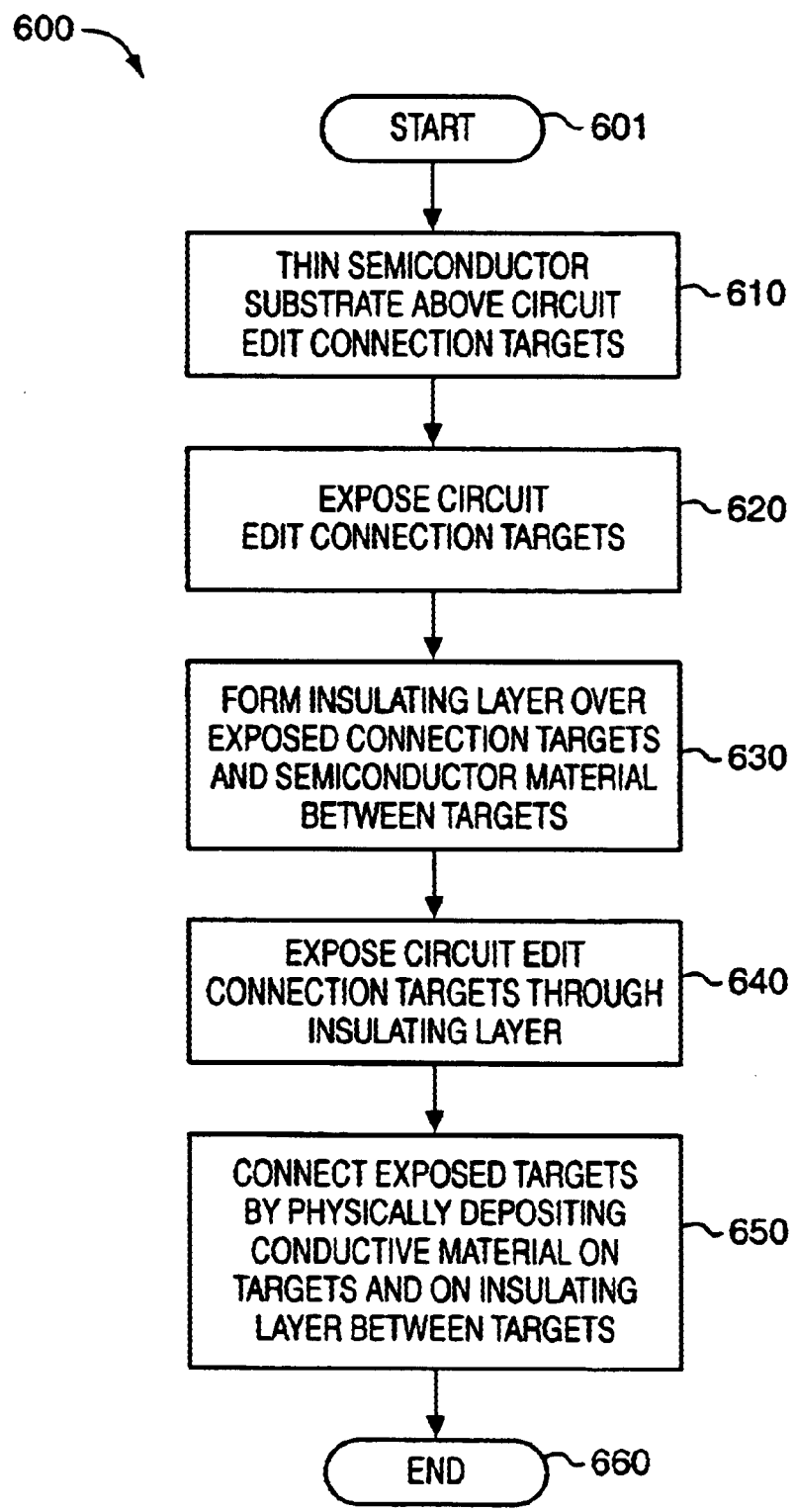

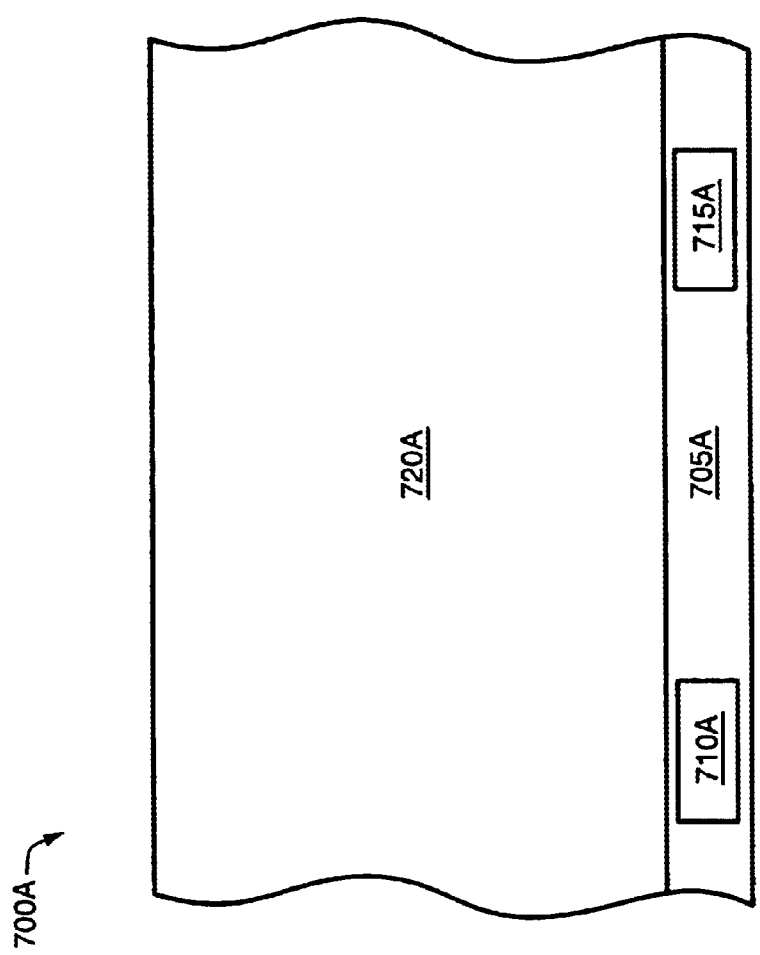

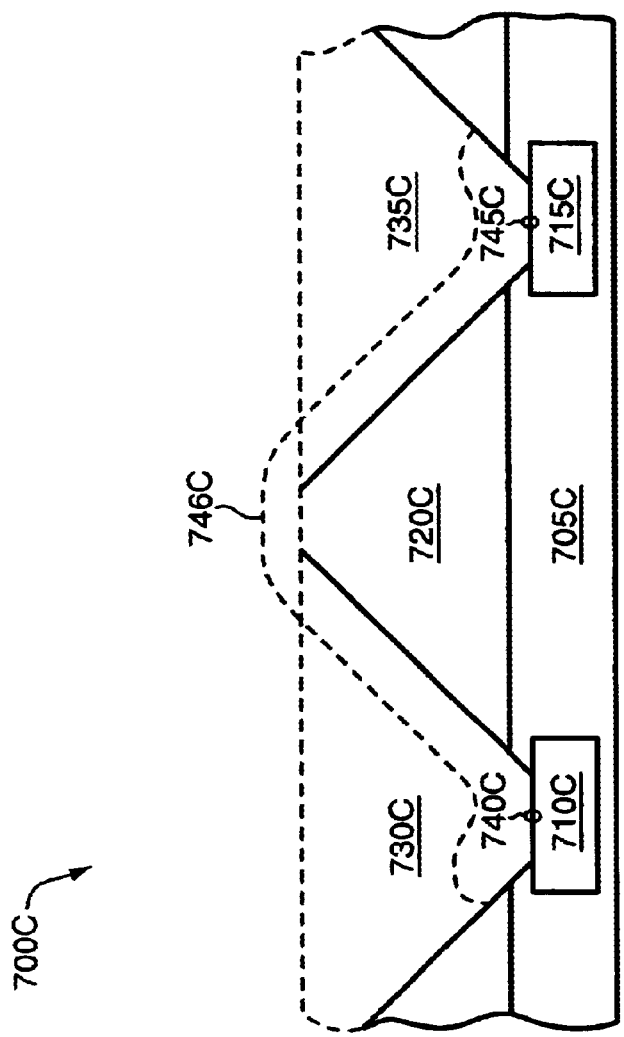

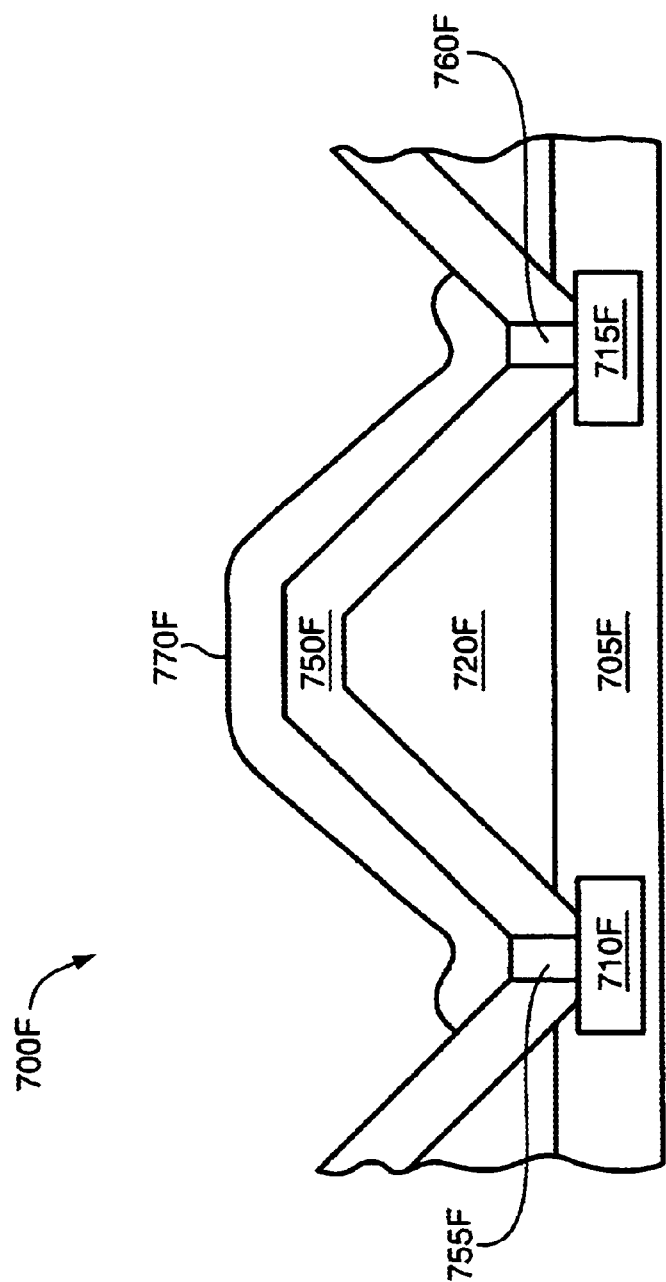

PHYSICALLY DEPOSITED LAYER TO ELECTRICALLY CONNECT CIRCUIT EDIT CONNECTION TARGETS

BACKGROUND

1. Field

Embodiments of the present invention relate to modification of an integrated circuit during a circuit edit. More particularly, the embodiments relate to a system and method for physically depositing an electrically conductive layer to connect circuit edit connection targets in an integrated circuit, and to an integrated circuit containing the layer.

2. Background Information

Newly designed integrated circuits often contain bugs due to errors in the circuit design. A bug represents a portion of an integrated circuit that does not function properly or as desired. A process known as debugging is used to extensively test a fabricated integrated circuit in order to detect and identify these bugs. After a bug is identified, the design of the integrated circuit is modified to eliminate the bug so that the bug will not be formed in subsequently manufactured integrated circuits. By this process of identifying bugs and correcting the design to remove the identified bugs, a final fully-functional integrated circuit design may be obtained and used to mass produce integrated circuits.

Circuit edits are commonly performed during the debugging process so that the debugging process may continue with the affects of the known bug neutralized. A circuit edit involves modifying a previously fabricated integrated circuit having a known bug in order to correct the bug. As an example, once a bug based on a missing connection between interconnect lines is identified, a circuit edit may be performed wherein a layer is deposited by Chemical Vapor Deposition (CVD) in order to connect the two interconnect lines and thereby kill the bug. In this way, the circuit edit may allow a temporary electrical connection to be established between the circuits so that further integrated circuit testing may be performed as if that particular bug never existed. The circuit edit approach is generally regarded as faster and less costly to implement compared with tapeout of a new mask layer and re-fabricating integrated circuits for each identified bug.

FIG. 1 illustrates a CVD layer 160 formed during a circuit edit of the integrated circuit 100. The layer 160 connects a first interconnect 140A and a second interconnect 140B. This connection allows exchange of electrical signals between devices formed within doped regions 120A–B through vias 130A–B, the interconnects 140A–B, and the CVD connection layer 160. Such exchange of electrical signals would not be possible without the layer, due to the dielectric region 150. Accordingly, the layer provides an electrical connection between the first and second doped regions that was not present initially.

The CVD connection layer is formed by milling down through the dielectric to expose the interconnects, depositing gaseous tungsten hexacarbonyl $W(CO)_6$ on and between the exposed interconnects, and then releasing the tungsten atoms from the hexacarbonyl precursor compounds by transferring sufficient energy with a Focused Ion Beam (FIB) to break the tungsten free from the precursor compounds and disperse the precursor to allow deposition of the tungsten. Among the problems associated with layers formed by this process include incomplete removal of the organic precursor compounds.

FIG. 2 shows a sample of material 200 taken from the layer 160. As expected, the sample contains primarily tungsten 210. However, the sample additionally contains other non-tungsten impurities that cause the sample to have a poor electrical conductivity. Organic precursor residuals 220 are one prevalent form of impurity. In this particular example, the organic precursor residuals may include unconverted tungsten hexacarbonyl or carbonyl groups that have failed to disperse. The organic precursor residuals contain carbon that contributes an electrical resistance to the sample. Voids 230 such as bubbles may also be present due to FIB conversion of the layer. Other impurities 240 may also be present and may include derivatives of the organic precursors that have formed under the harsh conditions present during FIB conversion of the organometallic layer.

One significant problem with the impurities is increased electrical resistance. Each of these species provides a significantly greater electrical resistance than tungsten. Depending upon the amount of such impurities, the layer may have an electrical resistivity that may be greater than 160 micro Ohms centimeter, greater than 200 micro Ohms centimeter, or even higher. This is between about 30–35 times the resistivity of pure tungsten, which is about 5.5 micro Ohms centimeters. Such electrical resistances are not desired, particularly when a connection is to be made between interconnects that are spaced widely apart, because the resistances can significantly diminish the electrical signals.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 6 shows a method for connecting circuit edit connection targets in a flip-chip integrated circuit by physically depositing conductive material on the targets to provide electrical contact with the targets and between the targets to provide a conductive path between the targets, according to one embodiment of the present invention.

FIGS. 7A–7F show flip-chip integrated circuit substrates at different stages of a method for connecting circuit edit connection targets with a layer containing a physically deposited electrically conductive material, according to one embodiment of the present invention.

DETAILED DESCRIPTION

Described herein are systems and methods for connecting circuit edit connection targets in integrated circuits with layers containing physically deposited electrically conductive materials. In the following description, numerous specific details are set forth. However, it is understood that embodiments of the invention may be practiced without these specific details. In other instances, well-known circuits, structures and techniques have not been shown in detail in order not to obscure the understanding of this description.

I. Integrated Circuit Containing a Circuit Edit Connection Layer

Figure 1:
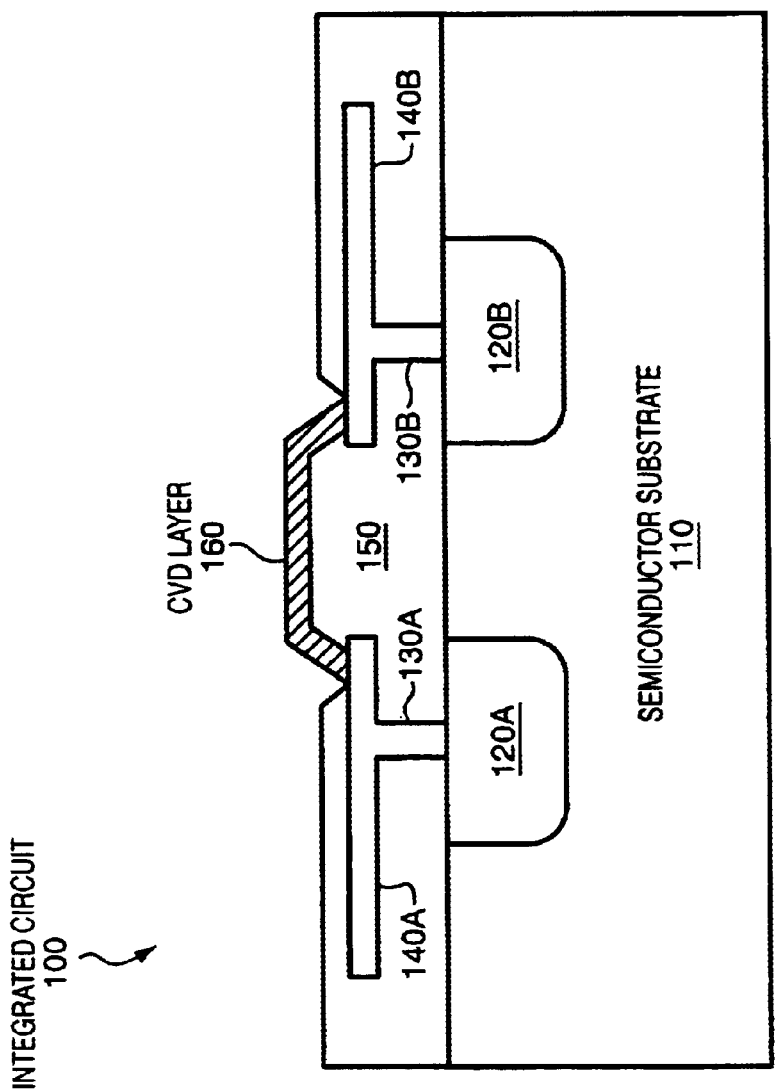
FIG. 1 shows an integrated circuit after a prior art circuit edit modification to create an electrical connection between two interconnects by forming a connective layer of tungsten with a CVD process; the tungsten layer formed by such a process contains impurities associated with the CVD process, which give the layer a generally poor electrical conductivity.
Figure 2:
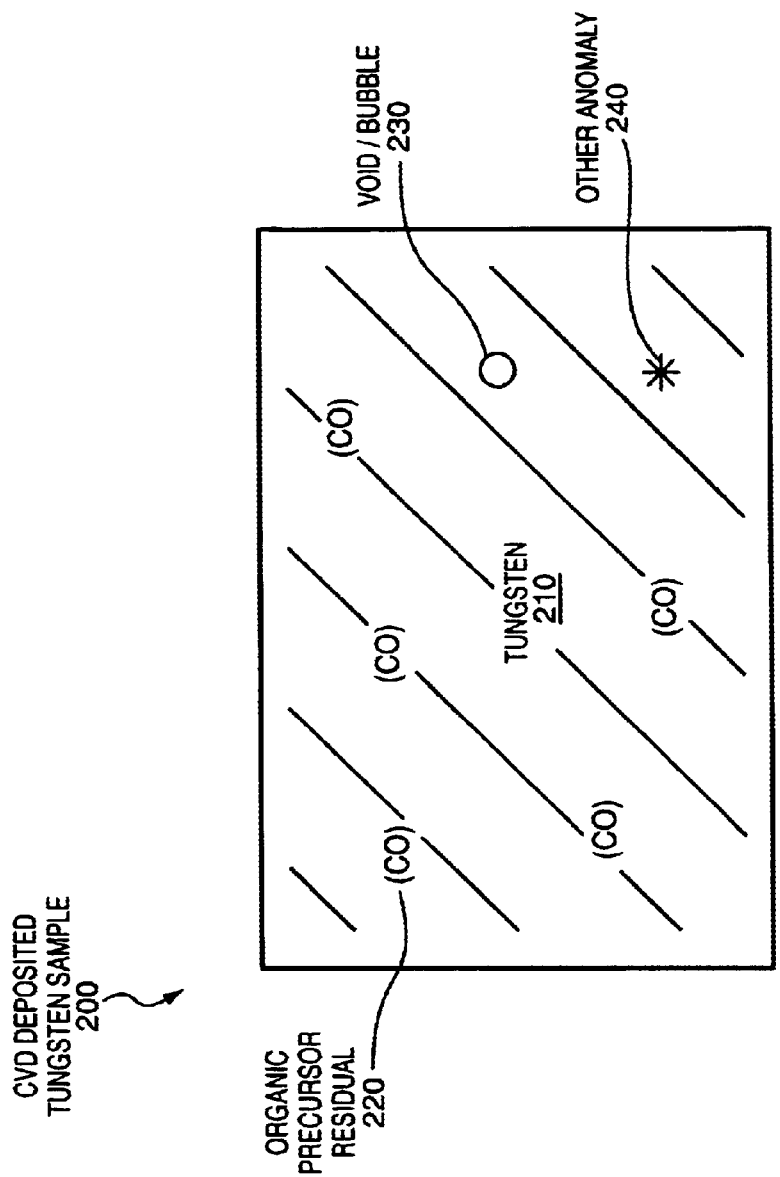
FIG. 2 shows a sample of tungsten material formed with a CVD process, the sample contains organic precursor residuals, voids, and other impurities associated with the CVD process which give the sample a poor electrical conductivity.
Figure 3:
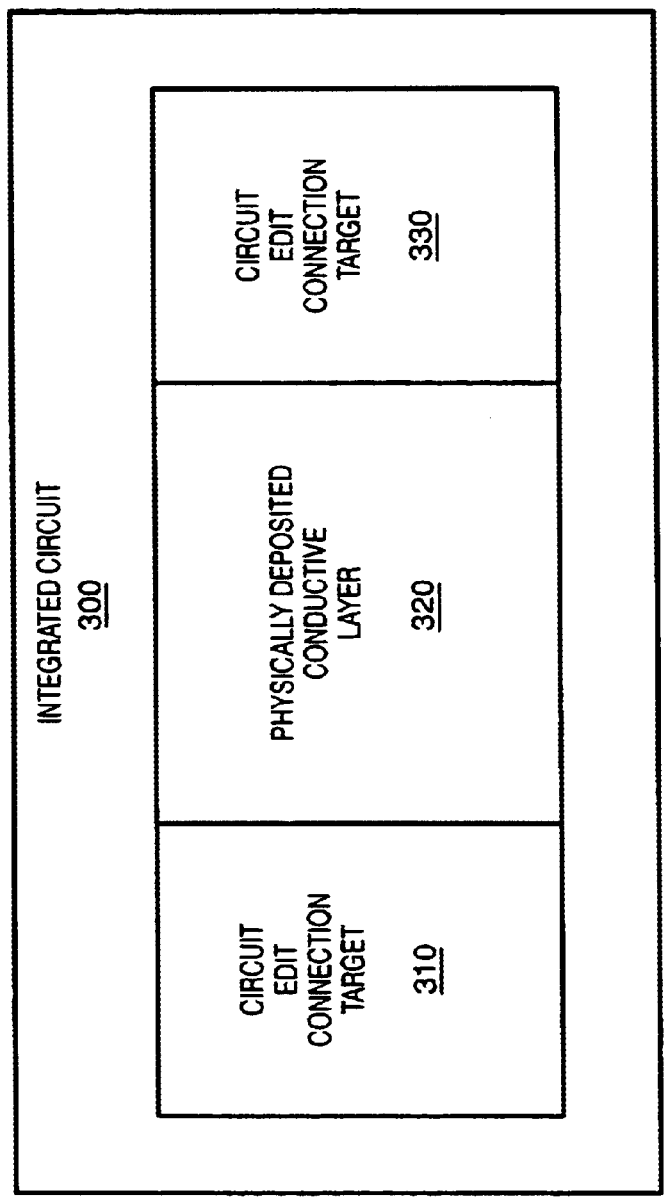
FIG. 3 shows an integrated circuit containing a physically deposited conductive layer disposed between and connecting two circuit edit connection targets, according to one embodiment of the present invention.

FIG. 3 shows an integrated circuit 300 containing a first circuit edit connection target 310, a second circuit edit connection target 330, and a layer 320 containing a physically deposited electrically conductive material that is electrically coupled with and physically disposed between the targets 310 and 330 to electrically connect the targets. The layer may contain a material deposited by a non-reactive physical deposition process that includes physically depositing a material from a source to the layer without changing the chemical composition of the material. This is in contrast to a reactive chemical deposition, such as for example CVD, which involves depositing a material based on a chemical reaction and conversion of a starting material. Particular physical deposition processes that are contemplated include sputtering and thermal evaporation, although these are not required, and other Physical Vapor Deposition (PVD) processes that are well known in the semiconductor processing arts may also be used.

Sputtering and thermal evaporation may both be used to deposit a conductive material on the integrated circuit without introducing numerous impurities, such as the organic precursor residuals found in CVD layers. Accordingly, the layer may provide a relatively high electrical conductivity connection between the targets, compared to prior art layers deposited by CVD. Experiments by the present inventors with gold layers deposited by sputtering indicate that it is typical to obtain electrical resistivities that are less than about 50 micro Ohm centimeter, and that often the resistivities are between about 5–20 micro Ohm centimeter, or less. That is, the resistivities are typically less than 20 times, and often between about 2–8 times, the resistivity of pure gold, which is about 2.4 micro Ohm centimeter. Accordingly, the layers have much less resistance than those deposited by CVD, which typically have resistivities at least 30 times the pure material values. These resistivities and ratios should pertain to many other conductive metals.

It is contemplated that the layer 320 may be used to connect a variety of different circuit edit connection targets found in integrated circuits. In general, the circuit edit connection targets 310 and 330 may represent any signaling material or signal path found in integrated circuits. The signaling material or signal path typically contains a conductive material, such as a metal, or at least a partially conductive material, such as a doped semiconductor material. One exemplary circuit edit connection target is an interconnect. Interconnects are patterned conductive material often lines that are used to distribute electrical signals to a semiconductor substrate. Another exemplary circuit edit connection target is a via or contact. Vias and contacts are conductive material disposed between interconnects or other conductive materials on different levels of a multi-level interconnect structure in order to connect the conductive materials at different levels. Of course, the layer may be used to connect other desired connection targets including but not limited to well taps, doped semiconductor regions (e.g., diffusion, doped polysilicon, doped single crystal silicon), refractory metal silicides, and other at least partially conductive materials and structures found in integrated circuits.

II. Method for Connecting Circuit Edit Connection Targets

Figure 4:
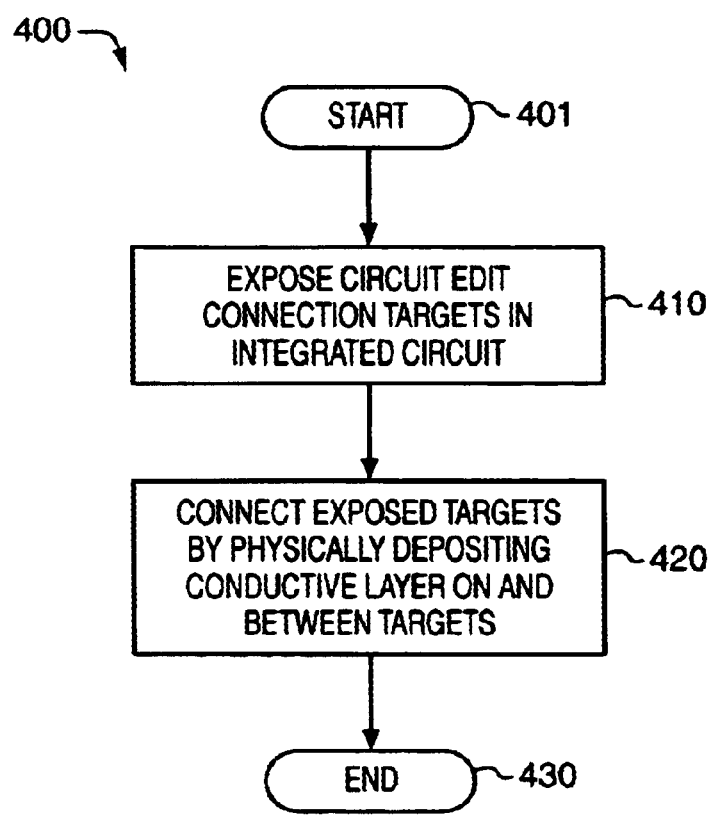
FIG. 4 shows a method for connecting circuit edit connection targets by physically depositing conductive material on the targets to provide electrical contact with the targets and between the targets to provide a conductive path between the targets, according to one embodiment of the present invention.

FIG. 4 shows a method 400 for connecting circuit edit connection targets by physically depositing a connective layer on and between the targets, according to one embodiment of the present invention. The method may be used on a variety of integrated circuits, including flip-chip integrated circuits, wire-bonded integrated circuits, and others. After commencing at block 401, the method proceeds to block 410 where a plurality of circuit edit connection targets are exposed by removing portions of integrated circuit materials over the targets until the targets are sufficiently exposed. These materials are often removed selectively, and in a non-destructive way, so that the operation of the integrated circuit is not compromised.

In the following description, a method for exposing targets within a flip-chip integrated circuit is disclosed. In short, the method includes globally thinning the back side of a semiconductor substrate, by Chemical Mechanical Polishing or another technique, and then exposing the targets through the remaining semiconductor substrate (and potentially through interconnect structure dielectric) by focused ion beam milling or another technique. Also disclosed is a method for exposing targets in a wire-bonded integrated circuit. Briefly, this method includes removing dielectric material from a multi-level interconnect structure until the targets are sufficiently exposed by focused ion beam milling or another desired technique. Exposing targets within these exemplary types of integrated circuits is disclosed in order to further illustrate the applicability of various embodiments of the present invention to different types of integrated circuits. It is to be appreciated that the particular methods and techniques used to expose the integrated circuit do not limit the present invention and that other techniques that are well known in the semiconductor processing arts may also be used.

After the circuit edit connection targets have been sufficiently exposed, at block 420 the exposed targets are electrically connected by a layer containing a physically deposited conductive material that is formed over and between the targets. The conductive material may be a conductive metal such as gold, silver, copper, aluminum, chromium, platinum, tungsten, titanium, and alloys or blends thereof. Hereinafter, the term metal will include alloys.

Three particular methods for physically depositing the conductive material are disclosed below in order to illustrate the concepts of the different embodiments of the present invention. The first two methods include sputtering a conductive material. In the first method, a focused ion beam is used to sputter conductive material from a sample positioned outside a Focused Ion Beam system proximate the integrated circuit. In the second method, a focused ion beam is used to sputter conductive material from a sample within a Focused Ion Beam system. This method may allow greater control over the size and position of the deposited materials. A third method includes thermally evaporating a conductive material.

(A) Sputtering

The present inventor has discovered that sputtering is a useful technique for physically depositing conductive materials such as metals over and between circuit edit connection targets. Sputtering involves displacing material from a source, often through the impact of a beam of energized particles, and subsequently depositing the displaced material as a layer on a destination surface. The beams energized particles transfer their kinetic energy to surface atoms of the source during collision and physically dislodge them from the surface. The beams usually dislodge atoms within a few atomic layers of the surface. The dislodged particles may impact with and deposit on a surface that contains exposed circuit edit connection targets.

One beam of energized particles that is suitable for sputtering materials such as metals is a focused ion beam provided by a conventional Focused Ion Beam (FIB) system. The focused ion beam contains high-energy ions that have been generated, accelerated, focused, and directed within the FIB system. The rate of sputtering for a focused ion beam is related to the current density of the beam (number of ions conveyed by the beam per unit time) and the kinetic energy of the beams ions (depends on the mass and velocity of the ions). The kinetic energy affects the amount of material that each ion is able to displace and the current density affects the number of ions delivered by the beam. Most FIB systems allow adjustment of both of these parameters. In one particular instance, an argon ion beam from a 0.6 W FIB system may be able to displace on the order of about 4000 cubic micrometers per second of gold from a sample. However, it is to be appreciated that the invention is not limited by the rate of sputtering, since a desired layer may be formed by a higher sputtering rate for a shorter time or a lower sputtering rate for a longer time. The cone apex or ion spot diameter is another parameter that may often be adjusted. For example, when using a focused ion beam to remove material from a very tight region, a small beam of about 5 nanometers may be desired, whereas when removing material over a larger area a larger beam of about 15 nanometers may be desired.

One suitable FIB system is the Micrion FC 9800 available from Micrion Corporation, of Peabody Massachusetts (www.micrion.com). Other systems may also be used. Since FIB systems, such as the Micrion FC 9800, are used extensively in the semiconductor processing arts, they will not be discussed in further detail to avoid obscuring the concepts of the present invention. However, further background information on FIB systems is available from most FIB system vendors. Further background information is also available in Chapter 9, Applications of Ion Beam Microlithography and Direct Processing, of the Handbook of VLSI Microlithography, Second Edition, 2001, by John Helbert, available from William Andrew Publishing, among other sources.

B. Sputtering from a Metal Source Outside FIB System

According to one embodiment of the present invention, a focused ion beam is used to impact a metal sample that is positioned outside a FIB system in order to displace material from the sample and physically deposit it as a layer to connect circuit edit connection targets on an integrated circuit placed in position outside a FIB system and proximate the metal sample.

A focused beam of argon ions may be used in one instance, although this is not required. Initially, a vacuum between about $0.01 \times 10^{-3}$ Bar and about $0.1 \times 10^{-3}$ Bar may be established in the FIB chamber. Then, a low pressure of argon gas may be added to the chamber. The argon gas may be ionized, accelerated, focused, and directed as a focused beam of high kinetic energy positively charged argon ions into impact with a sample of sputtering material in the vicinity of the integrated circuit. The argon ions may each displace material from the sample. The displaced material may collide with and deposit as a layer over and between the connection targets of the integrated circuit. As stated above, the focused beam is not required. The present inventor has also found that argon plasma, generated in a chamber at a moderate pressure between about $0.01 \times 10^{-3}$ Bar and about $0.1 \times 10^{-3}$ Bar, may also be used to perform the sputtering.

Physical deposition by this embodiment of the present invention may be useful for connecting widely spaced apart circuit edit connection targets (e.g., targets separated by 50–150 micrometers, or more), since the approach may be used to deposit conductive material over large areas (e.g., between 50×50 square micrometers and 150×150 square micrometers, or more). The high conductivities may also be of benefit when the targets communicate by high frequency and high slope electrical signals. These layers may allow connecting targets that cannot be adequately connected by higher resistance CVD layers.

C. Sputtering from a Metal Source Within a FIB System

According to another embodiment of the present invention, a focused ion beam is used to impact a metal sample that is positioned within a FIB system in order to displace material from the sample and physically deposit it as a layer to connect circuit edit connection targets on an integrated circuit placed in position inside a FIB system.

A focused beam of gallium ions may be used in one instance, although this is not required. Experiments conducted by the present inventor indicate that such beams of gallium ions have sufficient mass, velocity, and kinetic energy to dislodge good yields of materials such as gold. Initially, a metal sample such as a wire, a sheet, a film, a coil, a block, or other sample is placed within a FIB system. The sample may contain an impact surface for the focused ion beam that is configured to have a particular predetermined angle relative to an angle of an incident focused ion beam, so that the beam along with dislodged metal atoms are deflected from the surface at a particular predetermined angle. Then, a high vacuum typically between about $10^{-7}$ Torr and about $1\times10^{-5}$ Torr may be established within the FIB system chamber.

Then gallium from a source of supercooled liquid gallium at room temperature may be ionized, accelerated, focused, and directed as a focused beam of high kinetic energy positively charged gallium ions (Ga$^+$) into impact with the surface of the metal sample. Often, the beam energy may be between about 30 keV (kilo-electron Volts) and about 50 keV and the beam current between about 10 pico Amps and about 20 nano Amps, although this is not required. The beam dislodges and propels metal from the sample in a direction that may depend upon the inclination of the metal surface and the incident angle of the focused ion beam. This direction may be controlled so that the displaced metal may collide with and deposit as a layer over and between the connection targets of the integrated circuit. Since the Advantageously, this directional control may be used to sputter layers with more positional control and over smaller and more controlled regions compared to the first embodiment.

Physical deposition by this embodiment of the present invention may provide improved control over the position and size of physically deposited layers, compared to the sputtering technique discussed above. This may make this approach useful for connecting more closely spaced apart circuit edit connection targets (e.g., targets separated by less than about 50 micrometers, or less than 10 micrometers), since the approach may be used to controllably deposit conductive material over small areas (e.g., areas around 10×10 square micrometers, or less).

D. Thermal Evaporation

According to a third embodiment of the present invention, thermal evaporation may be used to physically deposit a layer to connect circuit edit connection targets on an integrated circuit. Thermal evaporating includes inducing evaporation of conductive material (often a metal) at a source and inducing deposition or condensation of the evaporated material at a destination. This may include heating and establishing a vacuum (e.g., $10^{-6}$–$10^{-7}$ Torr) on a metal source to promote evaporation of the metal and then contacting a cooler surface of a substrate containing the connection targets with the evaporated metal in order to promote condensation and deposition of the metal.

The choice between sputtering and thermal evaporation often will depend upon the particular implementation. Sputtering is often able to provide better adhesion and higher density layers compared to thermal evaporation. Sputtering may also alloy the use of a greater number of conductive materials, including certain metals that are not easily deposited by thermal evaporation. However, the equipment for thermal evaporation is often less costly, and moreover, the number of process variables for thermal evaporation are often less. Thermal evaporation also works best for low to moderate melting point materials and metals.

III. Connecting Targets in Flip-Chip Integrated Circuits

Figure 5:
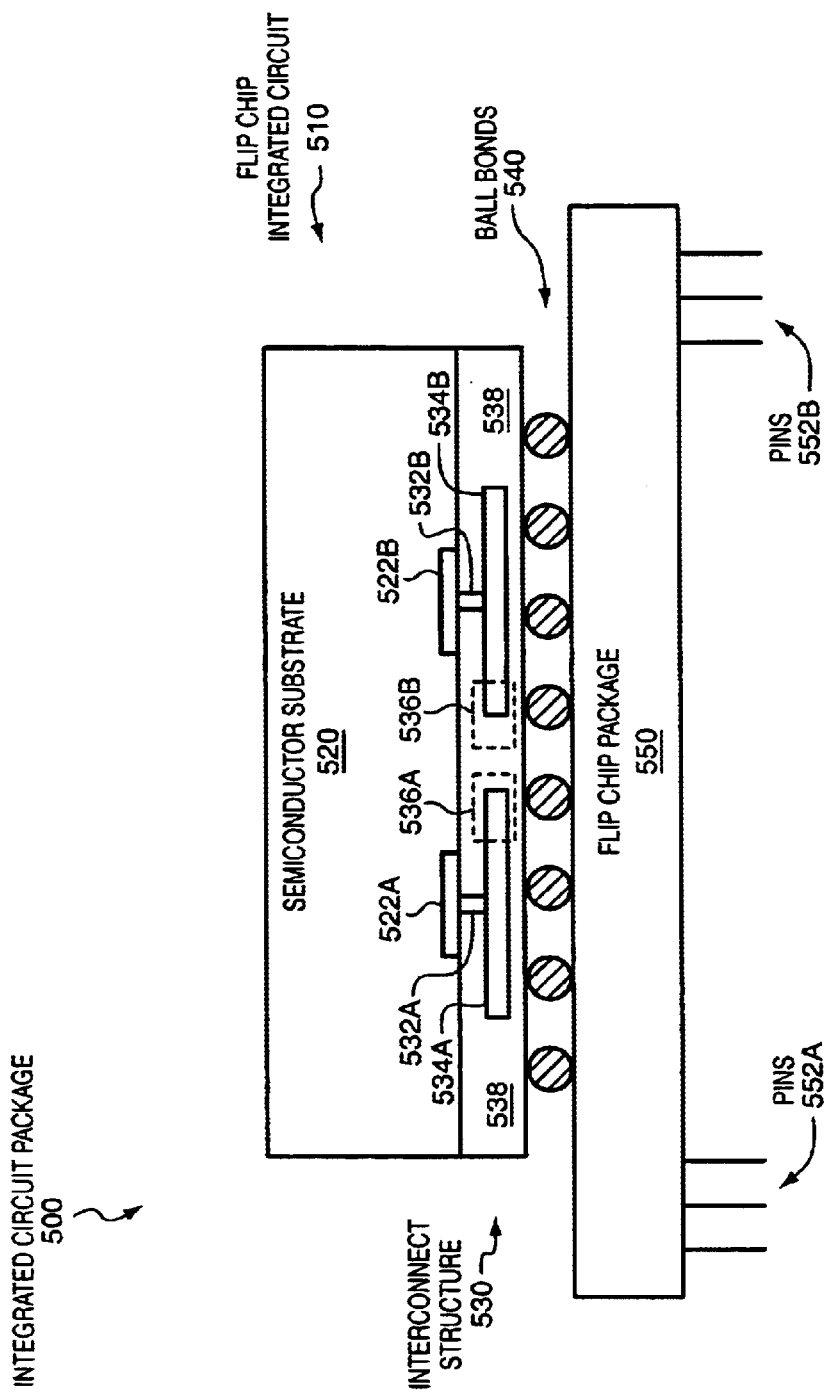
FIG. 5 shows an exemplary flip-chip integrated circuit package.

FIG. 5 shows a cross section of a flip-chip integrated circuit package 500 that may be modified during a circuit edit by forming an electrically conductive layer between circuit edit connection targets in order to connect the targets, according to one embodiment of the present invention. The particular package is based on flip-chip packaging technology, which is also known as control collapse chip connection (C4) packaging. Such technology has well-known advantages such as more direct electrical connection between integrated circuit circuitry and package pins, reduced inductance problems, and greater positional freedom in routing connections on the semiconductor substrate.

The package includes an integrated circuit 510, ball bonds 540, and a flip-chip package 550. The integrated circuit is flipped upside-down, relative to the orientation typically used for wire bonded integrated circuit packages, as is characteristic of flip-chip packaging. Accordingly, the backside of the semiconductor substrate is exposed. The flipped integrated circuit is physically and electrically attached to the flip-chip package by the ball bonds, which provide direct electrical connections from the bond pads to pins 552A–B of the flip-chip package.

Within the integrated circuit 510 are a semiconductor substrate 520 and an interconnect structure 530. The semiconductor substrate, often a silicon substrate, contains doped regions 522A and 522B formed within a typically thin active layer at the base of the silicon substrate. Each of the doped regions may contain semiconductor devices such as transistors, capacitors diodes, and resistors associated with the operation of the integrated circuit. The interconnect structure contains signaling mediums and paths, in this case interconnect lines and vias, in order to allow devices within the semiconductor substrate to exchange signals with each other and with other components connected through the pins 552A–B. The particular interconnect structure has been simplified to avoid obscuring the concepts of the invention, although those skilled in the art will appreciate that the interconnect structure may contain multiple levels of metal interconnects and vias.

The simplified interconnect structure contains a first via 532A and interconnect 534A that are connected with the doped region 522A and a second via 532B and interconnect 534B that are coupled with the doped region 522B. These interconnects and vias may be located at any level of a multi-level interconnect structure, although navigation to interconnects and vias at levels that are far away from the semiconductor-substrate interface may be more challenging.

The first interconnect 534A and the second interconnect 534B are not electrically connected and are unable to exchange electrical signals due to insulating or dielectric material 538 that is disposed between the interconnects. This missing electrical connection may constitute a logic bug that may be corrected during a circuit edit by physically depositing a layer to provide an electrical connection between a first circuit edit connection target 536A associated with the interconnect 534A and a second circuit edit connection target 536B associated with the interconnect 534B.

The targets 536A–B may represent any portions of the respective interconnects 534A–B. In this particular example, the targets may be proximate the endpoints or tip regions of the respective interconnects, since the tips are closely proximate one another and are far enough away from the doped regions to allow ease of access to the tips in order to expose them. Exposing the targets may include removing material down to the interconnect lines, and may additionally include removing some material of the interconnect line, as desired. Contact may also be established through a thin layer of dielectric material over the targets, although any such dielectric material will add resistance.

FIG. 6 shows a method 600 for connecting circuit edit connection targets within a flip-chip integrated circuit by physically depositing a connective layer on and between the targets, according to one embodiment of the present invention. The method represents one embodiment of the method 400 applied to a flip-chip integrated circuit.

The method commences at block 601 and then proceeds to block 610 where a backside portion of a semiconductor substrate is thinned above circuit edit connection targets, by CMP or other approach, in order to facilitate access to the connection targets. Then, at block 620 the circuit edit connection targets are exposed by removing portions of the thinned semiconductor substrate, and potentially portions of the interconnect structure dielectric, over the targets. This may be done by focused ion beam milling, although this is not required.

Blocks 630 and 640 are optional and may either be included in the method or omitted, as desired. At block 630 an insulating layer may be formed over a region of the integrated circuit that contains the exposed connection targets. Often this will be desired in order to electrically insulate the subsequently deposited conductive layer from conductors other than the intended connection targets, which may have been exposed during previous operations. This insulating layer may also provide insulation between the conductive layer and the semiconductor substrate (which may partially conduct current). If the insulating layer was formed at block 630, then at block 640 the circuit edit connection targets will typically be re-exposed through the insulating layer by removing portions of the insulating layer over the connection targets by milling, or by another desired technique.

Once the circuit edit connection targets have been exposed, the method advances to block 650 where the targets are connected by physically depositing conductive material over or on the exposed surfaces of the connection targets and over or on semiconductor substrate or insulating layer between the connection targets. Suitable physical depositions include sputtering and thermal evaporation, as well as other PVD techniques known in the semiconductor processing arts. In one case, a layer of a substantially pure high conductivity metal such as gold is deposited by sputtering in order to obtain a high conductivity connection between the targets. The method terminates at block 660.

FIGS. 7A–7F show cross-sectional views of portions of a flip-chip integrated circuit substrates at intermediate stages of a method for connecting circuit edit connection targets with a layer containing a physically deposited electrically conductive material, in accordance with one embodiment of the present invention.

FIG. 7A shows a first intermediate substrate 700A containing a semiconductor substrate 720A, a dielectric 705A, and un-connected circuit edit connection targets 710A and 715A. In one instance, the semiconductor substrate is a silicon die, the dielectric is an oxide of silicon (e.g., $SiO_2$), and the circuit edit connection targets are interconnects.

Figure 7B:
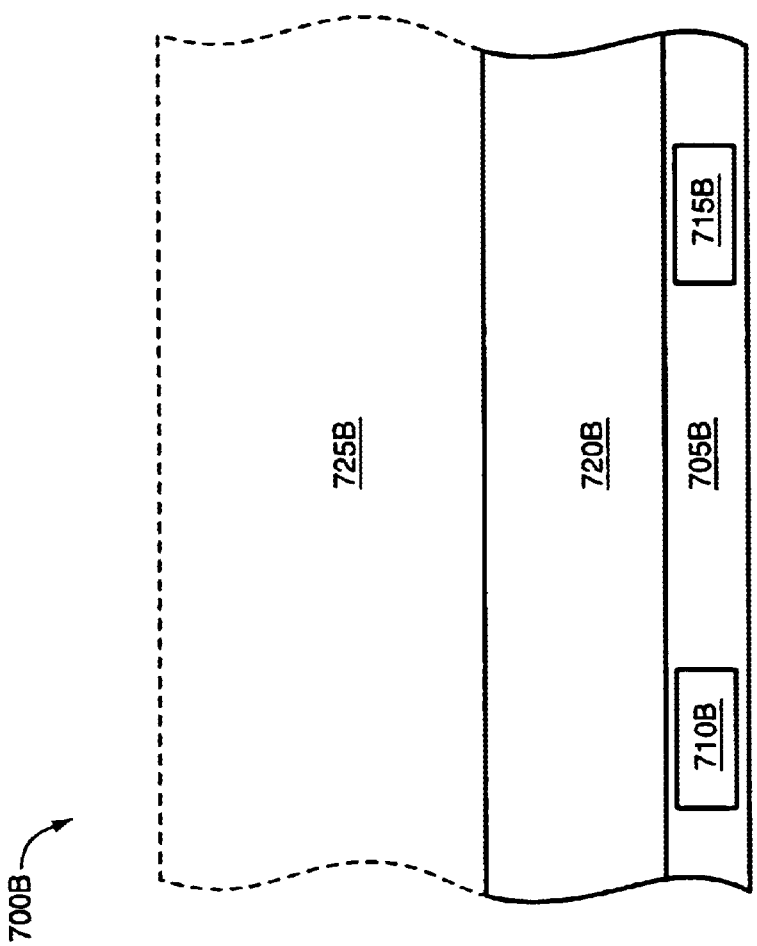

FIG. 7B shows a second intermediate substrate 700B after removing a backside portion 725B of the semiconductor substrate 720A over the connection targets in order to form thinned semiconductor substrate 720B. The portion may be removed by globally thinning the semiconductor substrate 720A using suitable thinning techniques such as mechanical polishing, mechanical machining, chemical etching, chemical mechanical polishing, or others commonly used in the semiconductor processing arts. The global thinning often facilitates subsequent exposure by a more localized subsequent technique. For example, the global thinning may be continued until the substrate thickness allows exposure of the connection targets by a focused ion beam milling technique but is sufficiently thick to prevent either exposure or damage to the active region of the semiconductor substrate. The present inventors have discovered that thickness between about 50 micrometers and about 300 micrometers is often sufficient, although thicker layers up to 700 micrometers or thicker may also be used, as desired.

Optionally, identification marks may be formed in the substrate 700B proximate the connection targets to facilitate location and identification of the targets during subsequent operations. Exemplary identification marks include among others etchings in the substrate 700B created by impact with a focused ion beam, markings on the substrate 700B created by depositing tungsten with a focused ion beam. These identification marks may allow visualization of the region with the visualization capabilities of a focused ion beam system, even after the marks are covered with an insulating layer, such as that shown in FIG. 7D.

FIG. 7C shows a third intermediate substrate 700C after removing portions 730C and 735C of the thinned semiconductor substrate 720B in order to expose portions 740C and 745C of the connection targets 710C and 715C. In this particular case, since the targets are interconnect lines separated from the semiconductor substrate by dielectric 705C, the removal also includes removing portions of the dielectric 705C over the connection targets. The portions may be removed by a localized technique such as a focused ion beam milling, laser micro-chemical thinning, laser ablation, or other techniques commonly used in the semiconductor processing arts.

In one embodiment of the present invention, a conductive layer 746C containing a physically deposited conductive material may be formed directly over the exposed connection targets and between the connection targets, as indicated by the dashed line. However, often it will be desirable to first form an insulating layer if there is any possibility that the previous semiconductor substrate removal operations may have exposed an unintended conductive material or structure (e.g., another interconnect line) that could form an unintended electrical connection with the layer 746C.

Figure 7D:
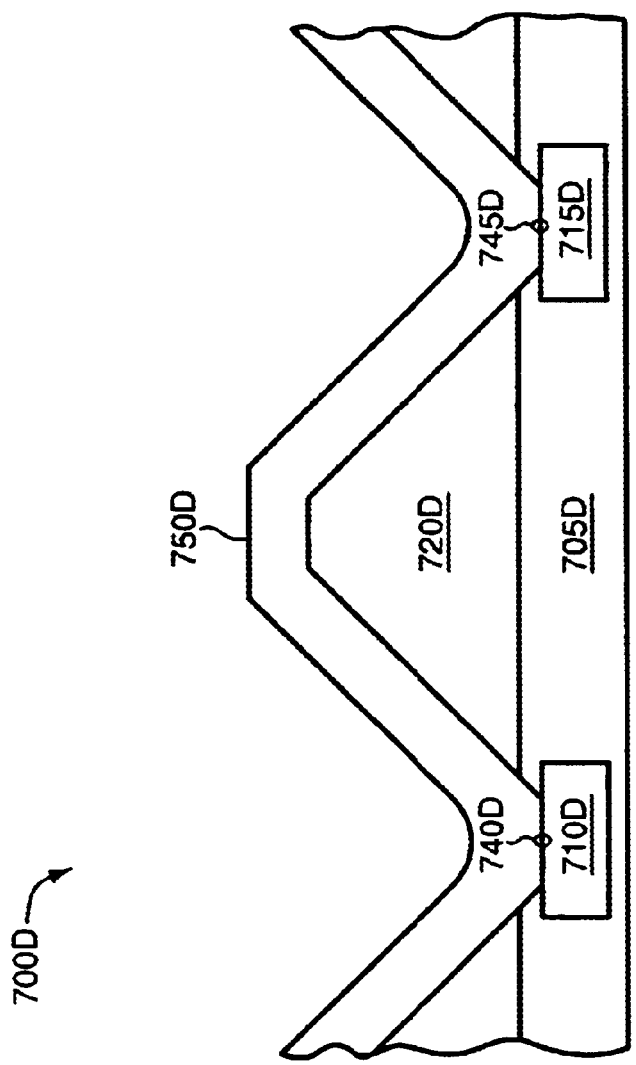

FIG. 7D shows a fourth intermediate substrate 700D after forming an insulation layer 750D over a region of the semiconductor substrate containing the exposed portions 740D and 745D of the circuit edit connection targets 710D and 715D. The insulation layer often contains a dielectric material such as an oxide of silicon (e.g., $SiO_2$) or another desired dielectric material. The insulation layer is often larger than the subsequently deposited conductive layer 770F (see FIG. 7F), This insulating layer may blanket the semiconductor substrate and insulate the substrate from the conductive layer, except at predetermined connection points corresponding to the intended circuit edit connection targets. The layer may also provide isolation from the semiconductor substrate itself, which may be a poor insulator.

A variety of techniques may be used to from the insulating layer 750D. When the connection targets are close together (e.g., less than about 50 micrometers) a local technique may be used to form a layer covering a comparatively small region. Localized deposition techniques may be used. Suitable localized deposition techniques include among others direct write depositions, focused ion beam induced CVD, laser induced CVD, electron beam induced CVD, and laser induced oxide of silicon growth. Alternatively, larger regions may be covered by global techniques such as plasma enhanced chemical vapor deposition (PECVD), thermal evaporation of a dielectric layer, sputter deposition of a dielectric layer, thermal growth of an oxide, or the like.

Figure 7E:
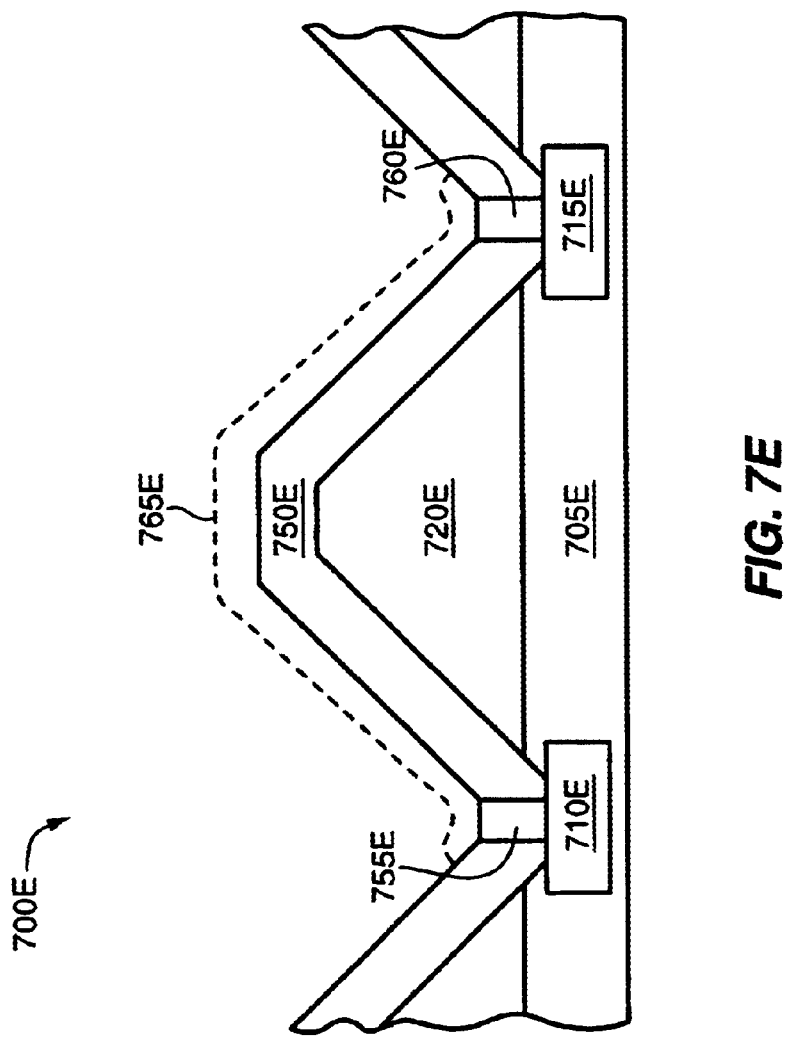

FIG. 7E shows a fifth intermediate substrate 700E after re-exposing the connection targets 710E and 715E through the insulating layer 750D and forming vias 755E and 760E on the connection targets 710E and 715E, respectively. As used herein, the vias include the completed structure of the opening in the insulation layer filled with conductive material. Formation of openings in insulating materials such as dielectrics and filling the openings with conductive via materials is well known in the semiconductor processing arts. For example, the openings may be formed by lithography and etch operations, by milling with a focused ion beam, or by other techniques that are commonly used in the semiconductor processing arts. The openings may be filled with a conductive material, such as tungsten, by focused ion beam deposition, metal PVD, sputtering, or other desired technique.

The vias are often desired in order to provide improved contact with the connection targets and avoid the need to form the conductive layer within tight openings having potentially high aspect ratios. However, it is to be appreciated that the vias are optional and do not limit the invention. According to an alternate embodiment of the present invention, after re-exposing the circuit edit connection targets through the insulation layer, the conductive layer may be formed directly on the re-exposed connection targets by physically deposing or sputtering metal on the targets and over the insulation layer between the targets.

It may be desirable to form a layer 765E containing tungsten deposited by focused ion beam deposition, or other material useful to improve contact and adhesion, over a region containing the vias 755E and 760E, as indicated by the dashed line, although this is optional. The present inventor has found that such tungsten layers may help improve contact and adhesion of certain layers such as sputtered gold layers. The layer 765E may also help mark and identify the indicated region.

FIG. 7F shows a sixth intermediate substrate 700F after forming a conductive layer 770F over a region containing the vias 755F and 760F including over the vias and over the insulating layer between the vias. The conductive layer electrically couples and connects the circuit edit connection targets through the vias 755F and 760F. The conductive layer often has a thickness between about 0.1–1 micrometers (a meter has one million micrometers), although this is not required. Thicker or thinner layers may also be used, although thinner layers may limit the amount of current flow. The conductive layer may contain a conductive material, such as gold or other desired metal, which has been physically deposited by sputtering, thermal evaporation, or other physical deposition techniques commonly used to deposit conductive materials or metals in the semiconductor processing arts.

The conductive layer provides a low resistance connection. For highly electrically conductive materials (e.g., gold, silver, copper, aluminum, chromium, platinum, tungsten, titanium, and alloys or blends thereof), the electrical resistivities are typically less than about 50 micro Ohm centimeter, and often between about 5–20 micro Ohm centimeter, or less. The electrical resistivities fall substantially close to the pure material resistivities, typically being within 20 times and often being between about 2–8 times (or less) the pure material resistivities. These low resistances may be particularly useful when connecting widely spaced connection targets.

This conductive layer and the associated connection may be useful for correcting a bug during a circuit edit to allow further debug testing to continue with the effects of the bug (the missing connection) neutralized. This ability to correct a bug during a circuit edit may have a big impact on the development time and cost involved with bringing a newly designed integrated circuit to production scale manufacturing.

Figure 8A:
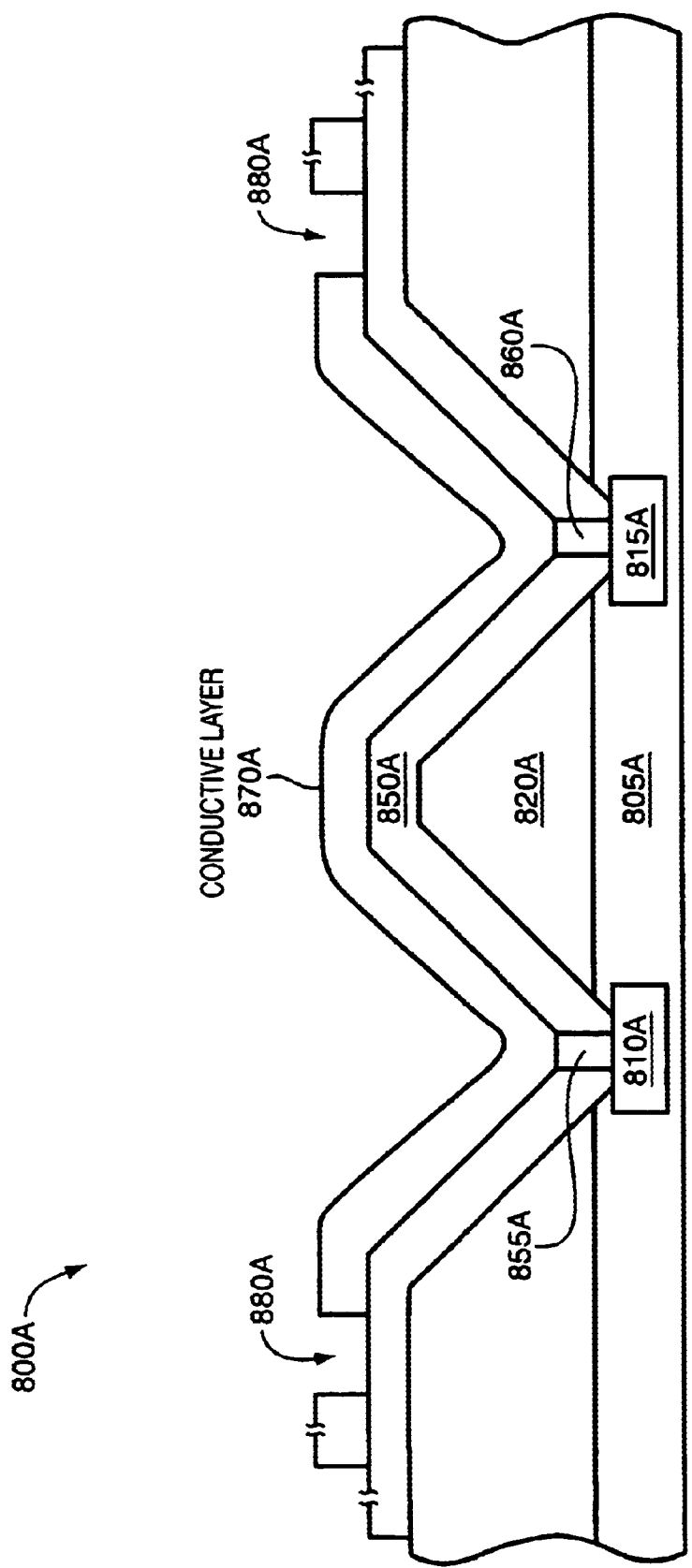
FIGS. 8A–B show cross-sectional and top views of an integrated circuit having a conductive layer, containing a physically deposited conductive material to connect circuit edit connection targets, and having trenches formed therein to help isolate the connection targets from unintended electrical connections, according to one embodiment of the present invention.
Figure 8B:
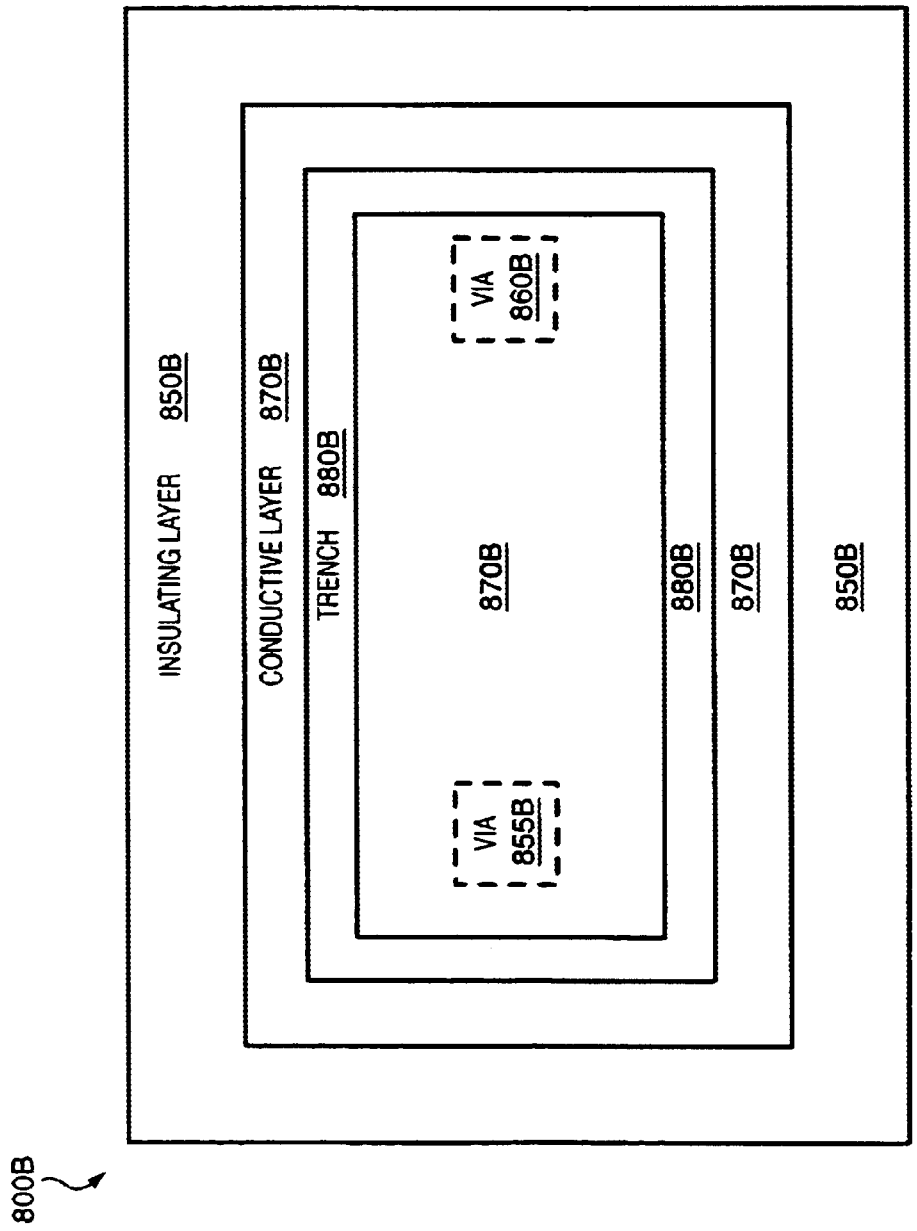

FIGS. 8A–8B respectively show cross-sectional and top views of an integrated circuit having a conductive layer, containing a physically deposited conductive material to connect circuit edit connection targets, and having trenches formed therein to help isolate the connection targets from unintended electrical connections, according to one embodiment of the present invention.

FIG. 8A shows an integrated circuit 800A containing a dielectric 805A, a first connection target 810A, a second connection target 815A, an edited silicon die. 820A, an insulating layer 850A, a first via 855A, a second via 860A, a conductive layer 870A, and trenches 880 formed through the conductive layer. The insulating layer is formed under the conductive layer over a region that contains the conductive layer. The conductive layer, is formed over the insulating layer over a region that contains the vias. In one instance, the conductive layer may cover a large region, such as a region larger than about 50×50 square micrometers, and the trenches may help avoid unintended electrical connections with conductive materials outside the trenches. FIG. 8B shows a corresponding top view of an integrated circuit 800B including an insulating layer 850B, a conductive layer 870B, trenches 880B, a first via 855B, and a second via 860B. Dashed lines are used to indicate that the conductive layer conceals the vias.

The trenches extend through the entire thickness of the conductive layer around a subregion of the conductive layer that contains the vias. The trenches electrically isolate a portion of the conductive layer that lies outside the trenches from another portion of the conductive layer that lies within the perimeter of the trenches. The trenches may be formed by focused ion beam milling and may have a width between about 5–15 nanometers, although this is not required. The trenches may avoid an un-intended electrical connection between one of the connection targets and another conductive material located outside of the trenches that may have unintentionally been exposed. Of course, the trenches are optional.

Figure 9:
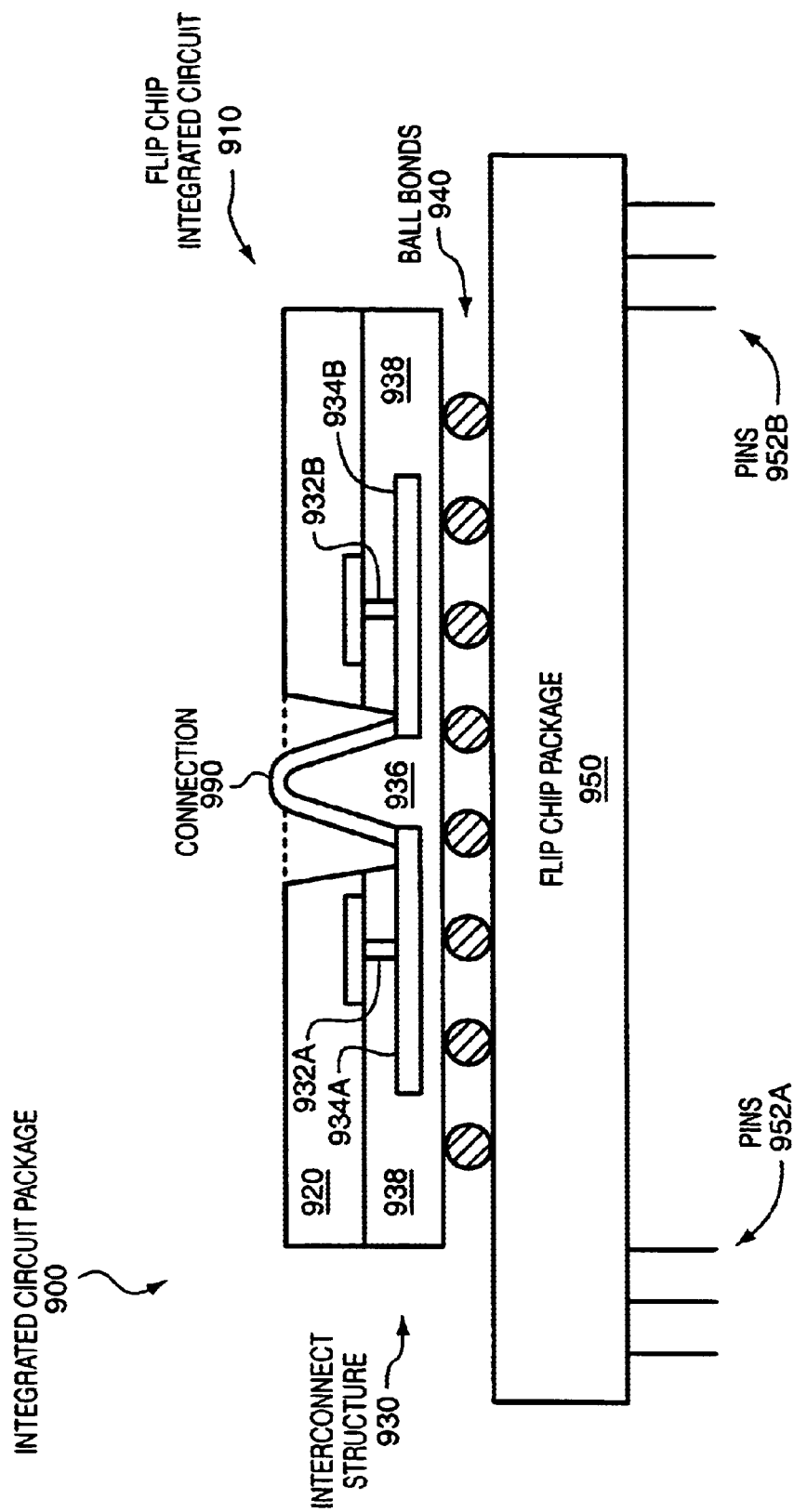
FIG. 9 shows an integrated circuit package after a circuit edit to form a connection containing a physically deposited electrically conductive layer between circuit edit connection targets, according to one embodiment of the present invention.

FIG. 9 shows a cross section of an integrated circuit package 900 after a circuit edit to form a connection 990 containing a physically deposited electrically conductive layer between circuit edit connection targets 934A and 934B, according to one embodiment of the present invention. As desired, the connection 990 may contain other optional features described herein, such as an insulating layer, vias, a tungsten line, and trenches.

IV. Connecting Targets in Wire-Bonded Integrated Circuits

Figure 10:
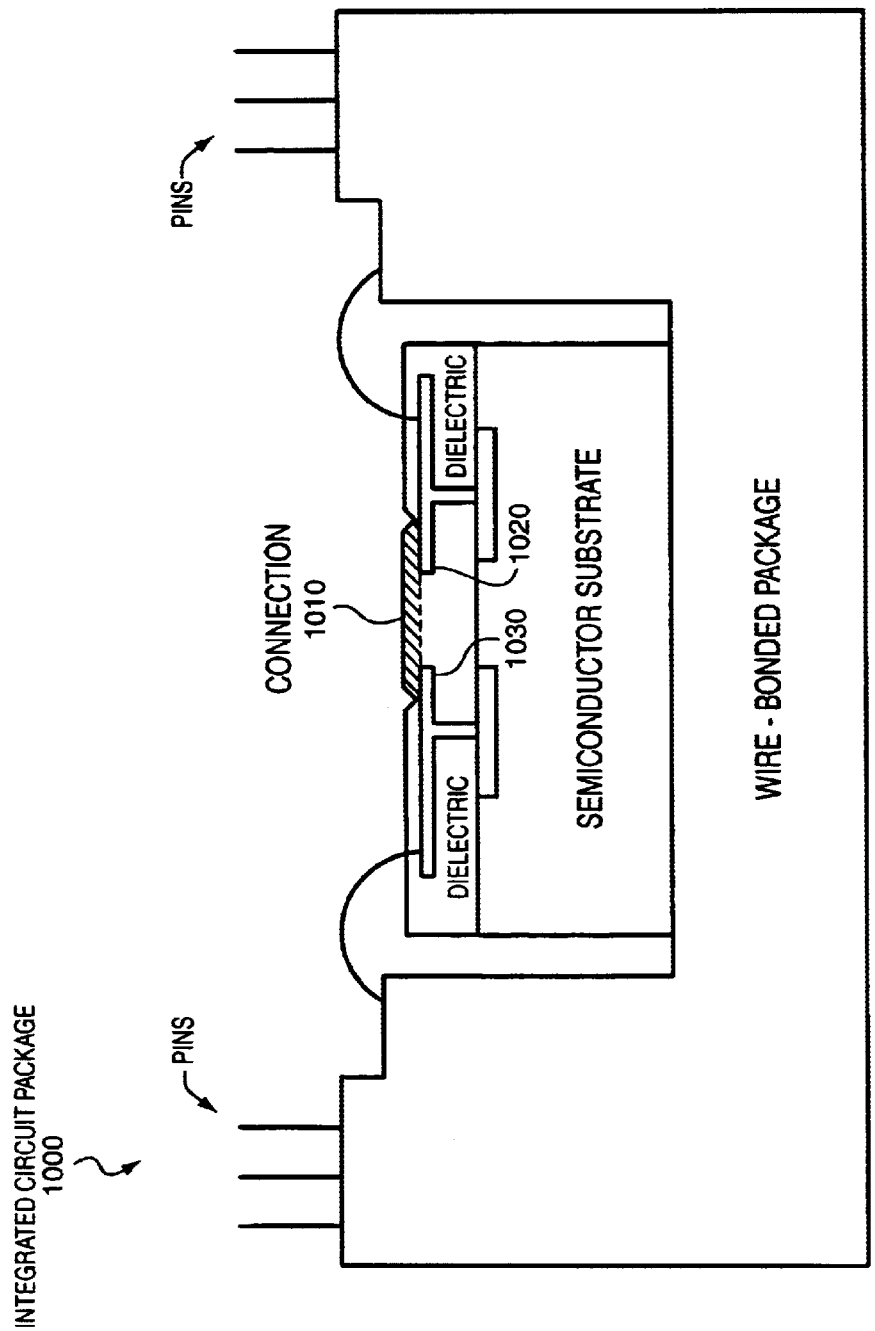
FIG. 10 shows a wire-bonded integrated circuit package after a circuit edit to form a connection containing physically deposited electrically conductive material between circuit edit connection targets, according to one embodiment of the present invention.

FIG. 10 shows a cross section of a wire-bonded integrated circuit package 1000 after a circuit edit to form a connection 1010 containing physically deposited electrically conductive material between circuit edit connection targets 1020 and 1030 (in this case interconnects), according to one embodiment of the present invention. In the wire-bonded integrated circuit, dielectric material over the connection targets has been removed, by techniques such as focused ion beam milling, in order to expose the targets. The dielectric material often provides sufficient insulation that an insulating layer may be avoided. Of course, the connection may include the insulating layer, vias, tungsten line, trenches, and other desired features.

Thus, systems and methods for forming layers containing physically deposited electrically conductive materials for connecting circuit edit connection targets in an integrated circuit have been disclosed. While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   connecting a first exposed circuit edit connection target with a second exposed circuit edit connection target by physically depositing a conductive material over the first target over the second target and between the first target and the second target; and
   forming a trench around an inside portion of the physically deposited conductive material containing at least the physically deposited conductive material that is over and between the targets by removing trench portions of the physically deposited conductive material with energized particles.

2. The method of claim 1, wherein said forming the trench comprises forming the trench that extends through an entire thickness of the physically deposited conductive material.

3. The method of claim 1, wherein said forming the trench comprises forming the trench by focused ion beam milling.

4. The method of claim 1, wherein said forming the trench comprises forming a trench the trench having a width of at least 5 nanometers.

5. The method of claim 1, wherein said physically depositing the conductive material comprises sputtering a metal.

6. The method of claim 5, wherein the metal is selected from the group consisting of gold, silver, copper, aluminum, chromium, platinum, tungsten, titanium, and combinations thereof.

7. The method of claim 5, wherein said physically depositing the conductive material comprises physically depositing a conductive layer having a thickness that is greater than 0.1 micrometers.

8. The method of claim 5, further comprising:
   prior to said physically depositing the conductive material, forming an insulating layer over the first target, over the second target, and between the first target and the second target;
   re-exposing the first target and the second target through the insulating layer; forming a first via over the first re-exposed target and forming a second via over the second re-exposed target; and
   after said forming the vias, performing said physically depositing the conductive material over the first target over the second target and between the first target and the second target.

9. The method of claim 8, wherein said forming the first via comprises filling an opening over the first re-exposed target by performing a focused ion beam deposition.

10. The method of claim 8, further comprising forming an adhesion promotion layer over a region containing the vias prior to said physically depositing the conductive material to promote adhesion of the conductive material.

11. The method of claim 10, wherein the adhesion promotion layer comprises tungsten, and wherein the conductive material comprises gold.

12. The method of claim 1, wherein said physically depositing the conductive material comprises focusing an ion beam on a sample of the conductive material that is positioned outside a focused ion beam system proximate to an integrated circuit containing the targets to sputter conductive material from the sample over and between the targets.

13. The method of claim 12 wherein said connecting the targets comprises connecting targets separated by at least 50 micrometers.

14. The method of claim 1, wherein said physically depositing the conductive material comprises focusing an ion beam on a sample of the conductive material that is positioned within a focused ion beam system to sputter conductive material from the sample over and between the targets.

15. The method of claim 14, wherein said connecting the targets comprises connecting targets separated by less than 50 micrometers.

16. The method of claim 1, wherein said physically depositing the conductive material comprises focusing an ion beam on a surface of a sample of the conductive material that is positioned within a focused ion beam system such that the beam has an angle relative to the surface to dislodge the conductive material from the sample and directionally deposit the dislodged conductive material over and between the targets based on the angle.

17. A method comprising:
   exposing a first circuit edit connection target and a second circuit edit connection target by removing a portion of an integrated circuit over the targets;
   electrically connecting the exposed targets by physically depositing a conductive material over the first target, over the second target, and between the first target and the second target; and
   forming a trench around an inside portion of the physically deposited conductive material containing at least the physically deposited conductive material over and between the targets by removing trench portions of the physically deposited conductive material with energized particles.

18. The method of claim 17, wherein said forming the trench comprises forming the trench that extends through an entire thickness of the physically deposited conductive material.

19. The method of claim 17, wherein said forming the trench comprises forming the trench by focused ion beam milling.

20. The method of claim 17, wherein said forming the trench comprises forming the trench having a width of at least 5 nanometers.

21. The method of claim 17, wherein said physically depositing the conductive material comprises sputtering a metal that is selected from the group consisting of gold, silver, copper, aluminum, chromium, platinum, tungsten, titanium, and combinations thereof to form a layer having a thickness that is greater than 0.1 micrometers.

22. The method of claim 17, further comprising:
   prior to said physically depositing the conductive material, forming an insulating layer over the first target, over the second target, and between the first target and the second target;
   re-exposing the first target and the second target through the insulating layer;
   forming a first via over the first re-exposed target and forming a second via over the second re-exposed target; and
   after said forming the vias, performing said physically depositing the conductive material over the first target over the second target and between the first target and the second target.

23. The method of claim 22, further comprising forming an adhesion promotion layer over a region containing the vias prior to said physically depositing the conductive material to improve adhesion of the conductive material.

24. The method of claim 17, wherein said physically depositing the conductive material comprises focusing an ion beam on a sample of the conductive material that is positioned outside a focused ion beam system proximate to an integrated circuit containing the targets to sputter conductive material from the sample over and between the targets, wherein the targets are separated by at least 50 micrometers.

25. The method of claim 17, wherein said physically depositing the conductive material comprises focusing an ion beam on a sample of the conductive material that is positioned within a focused ion beam system to sputter conductive material from the sample over and between the targets, wherein the targets are separated by less than 50 micrometers.

26. A method comprising:
exposing a first circuit edit connection target and a second circuit edit connection target by removing portions of an integrated circuit over the targets;
forming an insulating layer over the exposed circuit edit connection targets by depositing an insulating material;
re-exposing the circuit edit connection targets by removing portions of the insulating layer over the targets;
forming a first via over the re-exposed first target and forming a second via over the re-exposed second target by filling openings over the targets where the portions of the insulating material were removed with a via conductive material;
electrically connecting the targets by physically depositing a layer containing a conductive material over the first via, over the second via, and between the first via and the second via, wherein the layer has a thickness that is greater than 0.1 micrometers, and wherein the layer has an electrical resistivity that is less than 50 micro Ohm centimeter; and
forming a trench around an inside portion of the layer containing the physically deposited conductive material, the inside portion including at least the physically deposited conductive material over and between the vias, by removing trench portions of the layer with energized particles.

27. The method of claim 26, wherein said forming the trench comprises forming the trench that extends through an entire thickness of the physically deposited conductive material and has a width of at least 5 nanometers by focused ion beam milling.

28. The method of claim 26, wherein said physically depositing the conductive material comprises sputtering a metal that is selected from the group consisting of gold, silver, copper, aluminum, chromium, platinum, tungsten, titanium, and combinations thereof.

29. The method of claim 26, wherein said forming the vias by filling the openings comprises filling the openings by performing a focused ion beam deposition.

30. The method of claim 26, further comprising forming an adhesion promotion layer over a region containing the vias prior to said physically depositing the layer containing the conductive material to improve adhesion of the layer containing the conductive material.

31. The method of claim 26, wherein said physically depositing the conductive material comprises focusing an ion beam on a sample of the conductive material that is positioned outside a focused ion beam system proximate to an integrated circuit containing the targets to sputter conductive material from the sample over and between the targets, wherein the targets are separated by at least 50 micrometers.

32. The method of claim 26, wherein said physically depositing the conductive material comprises focusing an ion beam on a sample of the conductive material that is positioned within a focused ion beam system to sputter conductive material from the sample over and between the targets, wherein the targets are separated by less than 50 micrometers.

33. A method comprising:
detecting a first bug associated with a missing connection between a first circuit edit connection target and a second circuit edit connection target of an integrated circuit;
modifying a design for the integrated circuit to eliminate the first bug;
correcting the first bug by:
exposing the first circuit edit connection target and the second circuit edit connection target by removing a portion of the integrated circuit over the targets;
electrically connecting the exposed targets by physically depositing a conductive material over the first target, over the second target, and between the first target and the second target; and
forming a trench around an inside portion of the conductive material that is over and between the targets by removing trench portions of the conductive material with energized particles;
detecting one or more additional bugs in the integrated circuit after said electrically connecting the exposed targets; and
modifying the design for the integrated circuit to eliminate the one or more additional bugs.

34. The method of claim 33, wherein said forming the trench comprises forming the trench that extends through an entire thickness of the physically deposited conductive material and has a width of at least 5 nanometers by focused ion beam milling.

35. The method of claim 34, wherein said physically depositing the conductive material comprises focusing an ion beam on a sample of the conductive material that is positioned within a focused ion beam system to sputter conductive material from the sample over and between the targets, wherein the targets are separated by less than 50 micrometers.

* * * * *